(12) United States Patent
Jeon et al.

(10) Patent No.: US 9,773,955 B2
(45) Date of Patent: Sep. 26, 2017

(54) LIGHT CONVERSION PLATE, AND LIGHT-EMITTING DIODE PACKAGE, BACKLIGHT UNIT, AND DISPLAY DEVICE INCLUDING THE PLATE

(71) Applicant: LG ELECTRONICS INC., Seoul (KR)

(72) Inventors: Seongman Jeon, Seoul (KR); Jinmok Oh, Seoul (KR); Hyunkwon Shin, Seoul (KR); Jinwoo Sung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 32 days.

(21) Appl. No.: 14/885,478

(22) Filed: Oct. 16, 2015

(65) Prior Publication Data
US 2016/0322543 A1    Nov. 3, 2016

(30) Foreign Application Priority Data
Apr. 30, 2015    (KR) .................. 10-2015-0061284

(51) Int. Cl.
| | | |
|---|---|---|
| *H01L 33/50* | (2010.01) | |
| *F21V 9/16* | (2006.01) | |
| *F21V 8/00* | (2006.01) | |
| *G02F 1/1335* | (2006.01) | |
| *H01L 33/52* | (2010.01) | |
| *H01L 33/48* | (2010.01) | |

(52) U.S. Cl.
CPC ............ *H01L 33/505* (2013.01); *F21V 9/16* (2013.01); *G02B 6/0031* (2013.01); *G02B 6/0073* (2013.01); *G02F 1/133603* (2013.01); *G02F 1/133615* (2013.01); *H01L 33/501* (2013.01); *G02F 2001/133614* (2013.01); *G02F 2202/36* (2013.01); *H01L 33/48* (2013.01); *H01L 33/504* (2013.01); *H01L 33/507* (2013.01); *H01L 33/52* (2013.01)

(58) Field of Classification Search
CPC ....................................... H01L 33/50–33/508
See application file for complete search history.

(56) References Cited

U.S. PATENT DOCUMENTS

| | | | |
|---|---|---|---|
| 2006/0244358 A1* | 11/2006 | Kim ............... | C09K 11/025 313/486 |
| 2012/0113354 A1 | 5/2012 | Park | |
| 2012/0113672 A1 | 5/2012 | Dubrow et al. | |
| 2013/0009180 A1 | 1/2013 | Kim et al. | |
| 2014/0029298 A1 | 1/2014 | Hyun et al. | |

(Continued)

FOREIGN PATENT DOCUMENTS

| | | |
|---|---|---|
| EP | 2544032 A2 | 1/2013 |
| JP | 10-125463 A | 5/1998 |

(Continued)

*Primary Examiner* — Mariceli Santiago
(74) *Attorney, Agent, or Firm* — Birch, Stewart, Kolasch & Birch, LLP

(57) ABSTRACT

A light conversion plate including a first glass substrate; a light conversion layer disposed on the first glass substrate and including quantum dots that convert incident light into light having a specific wavelength range; and a second glass substrate disposed on the light conversion layer. Further, a surface of at least one of the first glass substrate and the second glass substrate includes a plurality of protrusion patterns.

18 Claims, 5 Drawing Sheets

(56) References Cited

U.S. PATENT DOCUMENTS

2014/0158982 A1     6/2014   Park et al.
2015/0308658 A1   10/2015   Shin et al.

FOREIGN PATENT DOCUMENTS

| | | |
|---|---|---|
| JP | 2007-194675 A | 8/2007 |
| KR | 10-2006-0087313 A | 8/2006 |
| KR | 10-2012-0047729 A | 5/2012 |
| KR | 10-2013-0084506 A | 7/2013 |
| KR | 10-2013-0110947 A | 10/2013 |
| KR | 10-2015-0004180 A | 1/2015 |
| WO | WO 2011/053635 A1 | 5/2011 |
| WO | WO 2012/105746 A1 | 8/2012 |
| WO | WO 2014/115992 A1 | 7/2014 |

\* cited by examiner (A)

(B)

(C)

LIGHT CONVERSION PLATE, AND LIGHT-EMITTING DIODE PACKAGE, BACKLIGHT UNIT, AND DISPLAY DEVICE INCLUDING THE PLATE

DISCUSSION OF THE BACKGROUND

Field of the Invention

The present disclosure relates to a light conversion plate, and a light-emitting diode package, a backlight unit, and a display device which include the light conversion plate, and more particularly, to a light conversion plate which can be used in a light-emitting diode package to obtain high brightness and high color reproducibility, and a light-emitting diode package, a backlight unit, and a display device, in which the light conversion plate is used.

Discussion of the Related Art

A light-emitting diode (LED) is a semiconductor device which converts electricity into light by using characteristics of a compound semiconductor, and LEDs have recently been used as light sources of various electronic products. In particular, the demand for white LEDs is high in the LED field. Typically, a method of combining and using various colored LED chips or a method of using an LED package, in which an LED chip emitting light of a specific color and a phosphor emitting fluorescence of a specific color are combined, has been used to manufacture a white LED.

Recently, instead of using a phosphor, research into methods of manufacturing a white LED using quantum dots, which have better brightness and color reproducibility than the phosphor, has been attempted. However, because the surfaces of currently available quantum dots are generally capped with a hydrophobic ligand for the improvement of dispersibility, the type of dispersible resin is extremely limited. In particular, because a silicon resin or an epoxy resin used as an LED sealing resin has poor affinity to the quantum dots, the quantum dots may not be uniformly distributed but may be agglomerated to reduce a luminous efficiency.

In addition, because quantum dots are easily degraded by the external environment such as heat or moisture, the quantum dots may be degraded by heat generated from an LED chip. Thus, the characteristics of an LED vary depending on the driving time.

SUMMARY OF THE INVENTION

Accordingly, one object of the present invention is to address the above-noted and other problems.

Another object of the present invention is to provide a light conversion plate that obtains a high brightness and high color reproducibility by not only effectively preventing the degradation of quantum dots, but having excellent light extraction performance when used in a light-emitting diode package.

Still another object is to provide a light-emitting diode package including the above-described light conversion plate, and a backlight unit and a display device which include the light-emitting diode package.

To achieve these and other advantages and in accordance with the purpose of the present invention, as embodied and broadly described herein, the present invention provides in one aspect a light conversion plate including a first glass substrate; a light conversion layer disposed on the first glass substrate and including quantum dots that convert incident light into light having a specific wavelength range; and a second glass substrate disposed on the light conversion layer. Further, a surface of at least one of the first glass substrate and the second glass substrate includes a plurality of protrusion patterns. The present invention also provides a corresponding light emitting diode package, backlight unit and display panel including the light conversion layer.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

Reference will now be made in detail to the preferred embodiments of the present invention, examples of which are illustrated in the accompanying drawings.

DETAILED DESCRIPTION OF EMBODIMENTS OF THE INVENTION

Figure 1:
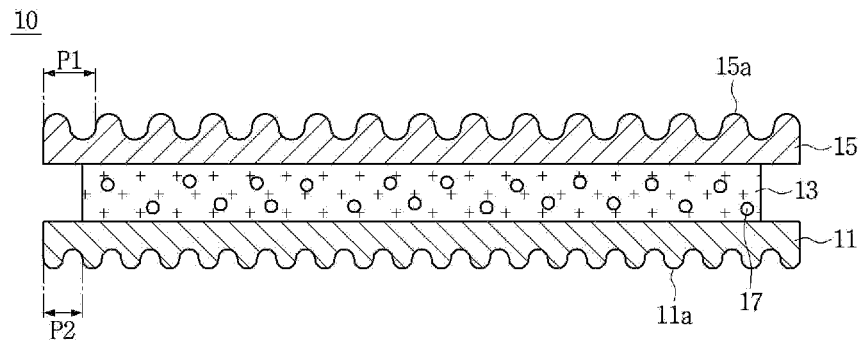
FIG. 1 illustrates a first embodiment of a light conversion plate of the present disclosure.

Advantages and features of the present disclosure, and implementation methods thereof will be clarified through following embodiments described with reference to the accompanying drawings. Since the shape, dimension, ratio, angle, and number disclosed in the drawings to describe embodiments of the present disclosure are exemplary, the present disclosure should not be limited to the drawings. Like reference numerals refer to like elements throughout. Moreover, detailed descriptions related to well-known technologies will be ruled out in order not to unnecessarily obscure subject matters of the present disclosure.

In this specification, terms, such as 'include', 'including', 'comprise', 'comprising', 'have', 'having', or 'comprised of', should be construed as not excluding the existence or addibility of other features, unless terms such as 'only' are used. Terms in the singular form used illustrating elements may include the plural form unless otherwise stated.

In the description of positional relationship, for example, in the case where positional relationship between two parts is described by using terms such as 'on', 'above', 'under', and 'beside', one or more other parts may also be disposed between the two parts unless terms such as 'exactly' or 'directly' are used. Also, the expression 'on' and 'under' in a backlight unit of the present disclosure are respectively defined as a side relatively close to a display panel and a side relatively far from the display panel when used in a display device. Furthermore, the expression "on" and "under" in the display panel of the present disclosure are respectively defined as a side relatively far from the backlight unit and a side relatively close to the backlight unit when used in the display device.

In the description of temporal relationship, for example, when a temporal order is described by using terms such as 'after', 'subsequently', 'following', and 'before', the temporal order may be discontinuous unless terms such as 'exactly' or 'directly' are used. Although the terms first and second are used herein to describe various elements, these elements should not be limited by these terms. These terms are only used to distinguish one element from another element. Thus, a first element could be termed a second element without departing from the scope of the present disclosure.

Respective features of various embodiments of the present disclosure may be partially or wholly combined with each other, a variety of linkages and driving may be made possible in the technical manner as those skilled in the art can fully understand, and the embodiments may be performed independently from each other or performed in association with each other.

Hereinafter, embodiments of the present disclosure will be described in detail with reference to the accompanying drawings. These embodiments are provided as an example so that this disclosure will fully convey the scope of the present disclosure to those skilled in the art. Thus, the present disclosure may be embodied in different forms and should not be construed as limited to the embodiments set forth herein.

Figure 2:
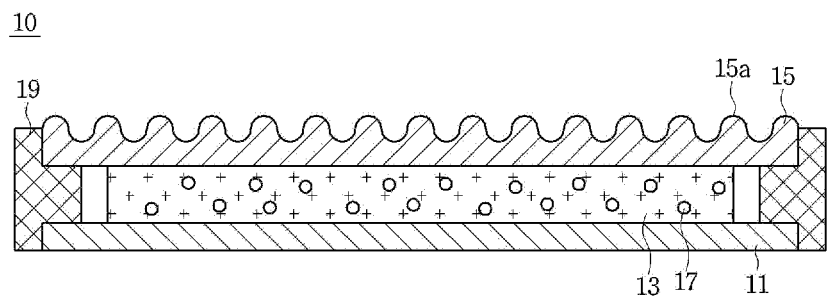
FIG. 2 illustrates a second embodiment of a light conversion plate of the present disclosure.
Figure 3:
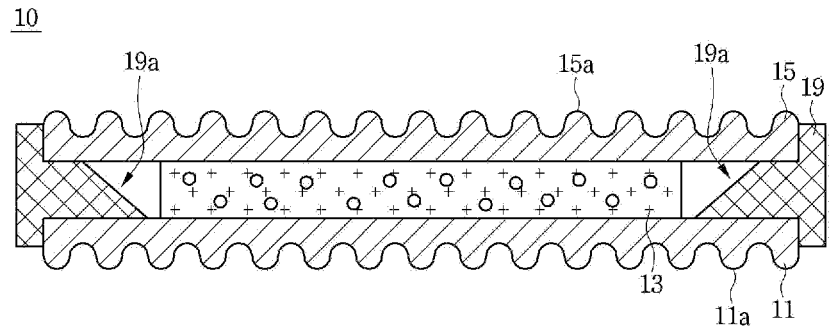
FIG. 3 illustrates a third embodiment of a light conversion plate of the present disclosure.

First, a light conversion plate 10 of an embodiment of the present disclosure will be described with reference to FIGS. 1 to 3. As illustrated in FIGS. 1 to 3, the light conversion plate 10 includes a first glass substrate 11, a light conversion layer 13, and a second glass substrate 15, where a plurality of protrusion patterns 11a and 15a are formed on a surface of at least one of the first glass substrate 11 and the second glass substrate 15.

The light conversion layer 13 converts a wavelength of light emitted from a light-emitting diode, and includes quantum dots 17 that convert incident light into light having a specific wavelength range. In particular, the quantum dot is a semiconductor crystal having a diameter of a few nanometers (nm), and is a material which emits light by converting the wavelength of the light incident from a light source by a quantum confinement effect.

In an embodiment of the present disclosure, as the quantum dots, quantum dots having a single layer or multilayer structure which include at least one semiconductor crystal selected from various quantum dots well known in the art, for example, CdS, CdO, CdSe, CdTe, $Cd_3P_2$, $Cd_3As_2$, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTe, HgO, HgS, HgSe, HgTe, $HgI_2$, AgI, AgBr, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, $GaInP_2$, InN, InP, InAs, InSb, $In_2S_3$, $In_2Se_3$, $TiO_2$, BP, Si, Ge, and combinations thereof may be used.

A diameter of the quantum dot may be in a range of 1 nm to 10 nm. Since an emission wavelength is changed according to the size of the quantum dot, light having a desired color can be obtained by selecting quantum dots having an appropriate size. In an embodiment of the present disclosure, examples of the quantum dot include a red light-emitting quantum dot, a green light-emitting quantum dot, or a combination thereof.

Further, the quantum dot may include a capping layer on the surface thereof in order to prevent agglomeration between the quantum dots. In particular, the capping layer may be a ligand layer coordination-bonded to the surface of the quantum dot or may be a surface layer coated with hydrophobic organic molecules. For example, the capping layer may be a material layer selected from phosphine oxide having a non-polar long chain alkyl or aryl group, organic amine, organic acid, phosphonic acid, and combinations thereof. In another example, the capping layer may be a material layer selected from tri-n-octylphosphine oxide (TOPO), stearic acid, palmitic acid, octadecylamine, hexadecylamine, dodecylamine, lauric acid, oleic acid, hexylphosphonic acid, and combinations thereof.

Also, the capping layer may be an inorganic ligand layer formed of an inorganic material such as sodium sulfide. The inorganic ligand layer as described above can be prepared by substituting an organic ligand with an inorganic ligand by mixing a solution having an inorganic material dissolved therein with a solution in which quantum dots having an organic ligand layer formed thereon are dispersed. With respect to quantum dots having the inorganic ligand layer as described above, since surfaces of the quantum dots are surrounded by the inorganic material having excellent barrier properties, stability is better than that of quantum dots having an organic ligand layer or a coating layer formed of organic molecules.

In an embodiment of the present disclosure, the type of the quantum dot included in the light conversion layer 13 may vary depending on the type of light-emitting diode chip mounted on a light-emitting diode package. For example, when a blue light-emitting diode chip is used, it is preferable to include red quantum dots or green quantum dots in the light conversion layer 13, and with respect to a light-emitting diode package composed of a blue light-emitting diode chip and an encapsulation layer including a green phosphor, it is preferable to include red quantum dots in the light conversion layer 13. Also, when a light-emitting diode package composed of a blue light-emitting diode chip and an encapsulation layer including a red phosphor is used, it is preferable to include green quantum dots in the light conversion layer 13.

The light conversion layer 13 may include the quantum dots 17 dispersed in a resin layer. In this instance, the resin layer is not particularly limited as long as it is formed of a resin in which quantum dots may be dispersed. For example, the resin layer may be formed by using polymer resins, such as a polyester acrylate resin, a polyurethane acrylate resin, an epoxy acrylate resin, an epoxy resin, a silicon resin, a polychlorotrifluoroethylene resin, a polyethylene resin, a polypropylene resin, a polyvinyl alcohol resin, a polyester resin, a polystyrene resin, and a polymethylmethacrylate resin, or resins including a monomer such as lauryl methacrylate, isobornyl acrylate, and isobornyl methacrylate.

Figure 4:
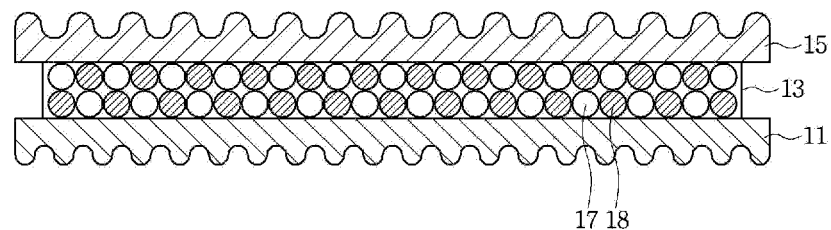
FIG. 4 illustrates a fourth embodiment of a light conversion plate of the present disclosure.

Also, the light conversion layer 13, as illustrated in FIG. 4, may include a superlattice in which the quantum dots 17 and inorganic nanoparticles 18 are regularly arranged. In particular, a superlattice structure denotes a structure in which two kinds of atoms are regularly arranged in a unit lattice, and when quantum dots and inorganic nanoparticles having a similar size to the quantum dot are dispersed in a solvent having high volatility and low specific gravity and the solvent is then evaporated, a supper lattice can be obtained while the quantum dots and the inorganic nanoparticles are self-aligned. The superlattice obtained by the above-described method is disposed on the first glass substrate 11 and the light conversion layer 13 can then be formed by fixing the superlattice on the glass substrate by depositing an inorganic layer on the superlattice using a chemical vapor deposition method such as atomic layer deposition.

With respect to the above-described light conversion layer 13, because the quantum dots 17 are protected by the inorganic particles and the inorganic layer having excellent barrier properties, the performance in preventing the degradation of quantum dots is excellent and accordingly, a sealing portion may not have to be formed on an edge portion.

In an embodiment of the present disclosure, glass substrates are respectively disposed on and under the light conversion layer 13. For convenience only, when used in the light-emitting diode package, a glass substrate disposed on a side facing the light-emitting diode chip is denoted as the first glass substrate 11, and a glass substrate disposed on an opposite side to the side facing the light-emitting diode chip is denoted as the second glass substrate 15. In this instance, the glass substrate is a glass plate or glass film having a thickness ranging from a few tens of μm to a few hundreds of μm, wherein the glass substrate as described above has excellent barrier properties to air or moisture in comparison to polymer films typically used as a light conversion film. Thus, when the glass substrates are disposed on and under the light conversion layer 13 as in an embodiment of the present disclosure, excellent performance in preventing the degradation of quantum dots can be obtained in comparison to when using a polymer barrier film.

However, with respect to the glass substrate, because a refractive index is higher than those of polymer materials, a reflectance at an interface of the glass substrate may be increased when a light conversion plate using the glass substrate is used in the light-emitting diode package. Thus, the efficiency of the light-emitting diode package may be reduced. Therefore, in an embodiment of the present disclosure, the protrusion patterns 11a and 15a are formed on the surface of the first glass substrate and/or the second glass substrate to address the above-described limitations.

In this instance, the protrusion patterns 11a and 15a may be formed on both of the first glass substrate 11 and the second glass substrate 15 as illustrated in FIGS. 1 and 3, and may be formed on one of the first glass substrate 11 and the second glass substrate, for example, a top surface of the second glass substrate 15, as illustrated in FIG. 2. When the protrusion patterns 11a and 15a are formed on the surface of the first glass substrate 11 and/or the second glass substrate 15 as described above, because an effect occurs in which an effective refractive index is gradually changed by the surface structure, reflection on the surface of the glass substrate is reduced and light extraction is increased. Thus, the efficiency of the light-emitting diode package is improved.

Specifically, when the protrusion pattern is formed on the surface of one of the first and second glass substrates, an effect of improving the efficiency by about 3% to about 4% can be obtained, and when the protrusion patterns are formed on both of the first and second glass substrates, an effect of improving the efficiency by about 6% to about 8% can be obtained.

Further, the protrusion patterns 11a and 15a may be formed by a method in which the surfaces of the glass substrates are etched using an etchant. For example, the surface of the glass substrate is deposited with a metal, and metal particles are then agglomerated through a high-temperature annealing treatment to form nano-sized metal aggregates. In addition, a protrusion pattern may be formed on the surface of the glass substrate by a method of etching the glass substrate using the metal aggregates as a mask. The protrusion pattern formed through the above-described method may not have the same shape, size, or spacing, but an average size or average spacing of the protrusion pattern may be appropriately controlled by adjusting an annealing temperature.

Further, the protrusion patterns 11a and 15a may be formed in a nanometer scale. For example, the size of the protrusion patterns 11a and 15a may be about a few hundred nm. The reason for this is that haze may occur when the size of the protrusion patterns 11a and 15a is in a micrometer scale. Also, the shape of the protrusion patterns 11a and 15a is not particularly limited, and the protrusion patterns 11a and 15a, for example, may be formed in various shapes such as a dot shape, a line shape, or an uneven shape.

In addition, the first glass substrate 11 may include one surface in contact with the light conversion layer 13 and another surface opposite to the one surface. Although it has been illustrated in FIGS. 1 to 4 that a width of the protrusion pattern 11a formed on the first glass substrate 11 is decreased while the protrusion pattern 11a extends from the one surface to the another surface, the embodiment is not limited thereto and the width of the protrusion pattern 11a may be increased while the protrusion pattern 11a extends from the one surface to the another surface. Also, the width of the protrusion pattern 11a may be constant while the protrusion pattern 11a extends from the one surface to the other surface.

Furthermore, the second glass substrate 15 may include one surface in contact with the light conversion layer 13 and another surface opposite to the one surface. Although it has been illustrated in FIGS. 1 to 4 that a width of the protrusion pattern 15a formed on the second glass substrate 15 is decreased while the protrusion pattern 15a extends from the one surface to the another surface, the embodiment is not limited thereto and the width of the protrusion pattern 15a may be increased while the protrusion pattern 15a extends from the one surface to the another surface. Also, the width of the protrusion pattern 15a may be constant while the protrusion pattern 15a extends from the one surface to the other surface.

Also, although FIGS. 1 to 4 illustrate the protrusion patterns 11a and 15a include a curved surface, the embodiment is not limited thereto and the protrusion patterns 11a and 15a may include at least one of a flat surface, an inclined surface, and a curved surface. When the protrusion patterns are formed on both of the first and second glass substrates, the shapes or average spacings P1 and P2 of the protrusion pattern (for convenience, referred to as "first protrusion pattern") formed on the first glass substrate and the protrusion pattern (for convenience, referred to as "second protrusion pattern") formed on the second glass substrate may be the same or different from each other. For example, the first protrusion pattern may be formed in a shape or a pattern which maximizes transmittance of light having a wavelength range emitted from the light-emitting diode, and the second protrusion pattern may be formed in a shape or a pattern which obtains a high light transmittance across the visible spectrum.

In addition, the light conversion plate of the present disclosure, as illustrated in FIGS. 2 and 3, may further include sealing portions 19 for sealing a gap between the first glass substrate 11 and the second glass substrate 15, if necessary. As illustrated in FIG. 1, when the gap exists between the first glass substrate 11 and the second glass substrate 15, air or moisture may penetrate through the gap to degrade the quantum dots 17 in the light conversion layer 13. Thus, the sealing portions 19, for example, may be used to seal between the first glass substrate 11 and the second glass substrate 15.

In this instance, a material of the sealing portion 19 is not particularly limited, and various sealing members, for example, a glass paste, a nanoparticle paste, a ceramic Torr seal member, or an ultraviolet (UV) resin, may be used without restriction. However, when a high temperature is required in a sealing process, the quantum dots 17 in the light conversion layer 13 may be degraded, and thus, it is preferable to use a low-temperature melting material melted at a relatively low temperature, for example, a low melting point glass paste or a nanoparticle paste which includes nanoparticles having a low melting point. In this instance, the low melting point glass paste may be a low melting point glass (melting point: 300° C. to 500° C.) containing at least one absorption ion selected from iron, copper, vanadium, and neodymium, and the nanoparticle paste may include $TiO_2$ and silver nanoparticles.

The sealing portion 19 may be formed by an appropriate method depending on the material used. For example, when the Torr seal member is used, the sealing portion may be formed by a nature curing method, and, when the UV resin is used, the sealing portion may be formed by a UV curing method.

Figure 5:
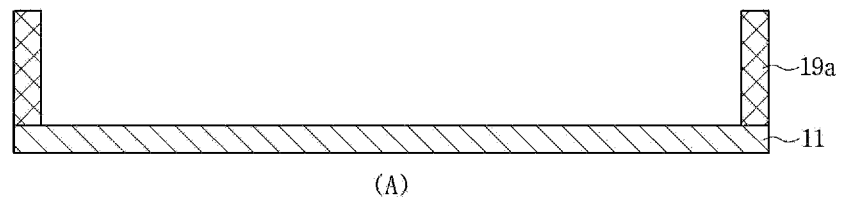
FIG. 5 illustrates a method of forming a sealing portion of the light conversion plate of the present disclosure.
Figure 5:
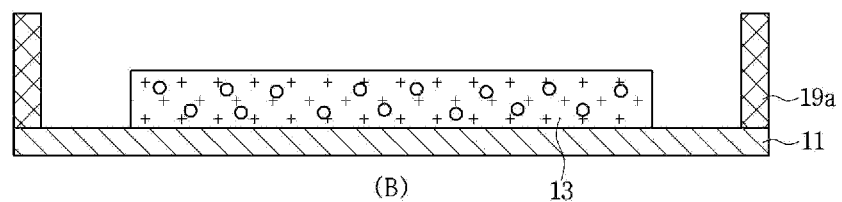
Figure 5:
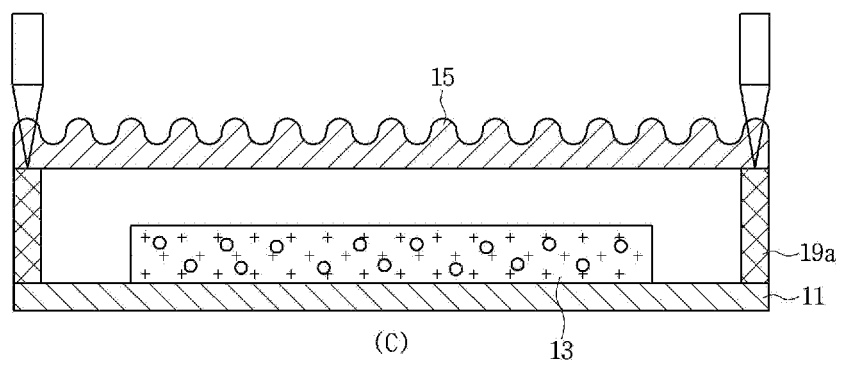

For example, the sealing portion 19 may be formed by curing low temperature melting materials by laser irradiation. In FIG. 5, a method of forming the sealing portion 19 by laser irradiation is illustrated. First, as illustrated in FIG. 5(A), a rim portion of the first glass substrate 11 is coated with a low-temperature melting material 19a, such as a low melting point glass paste, by using a method such as screen printing or dispensing. Next, as illustrated in FIG. 5(B), the light conversion layer 13 is formed on the first glass substrate 11 by using a resin solution in which quantum dots are dispersed.

Subsequently, as illustrated in FIG. 5(C), the second glass substrate 15 is stacked and the low-temperature melting material is cured by focusing a laser light on the low-temperature melting material to form a sealing portion. In this instance, a wavelength range of the laser light may be appropriately adjusted according to the material used, and for example, when a low melting point glass paste is used, a laser light having a wavelength range of 800 nm to 1,100 nm may be used. Also, a line width of the coated low-temperature melting material may be in a range of about 0.1 mm to about 1 mm, and the light conversion layer may be formed in an area spaced apart from the area which is coated with the low-temperature melting material (area of sealing portion) in order to prevent the damage of the quantum dots during the laser irradiation. In this instance, a distance between the light conversion layer and the area of sealing portion may be in a range of about 0.1 mm to about 0.5 mm.

When the sealing portion is formed by the laser irradiation as described above, the sealing portion may be formed to be higher than the light conversion layer as illustrated in FIG. 5. In this instance, because a gap is generated between the sealing portion and the light conversion layer, the damage of the quantum dots by the laser irradiation may be minimized.

As illustrated in FIG. 3, the sealing portion 19 may be formed to have an inclined surface 19a. In this instance, an angle ($\theta_2$) between the inclined surface and the first glass substrate can be greater than an angle ($\theta_1$) between the second glass substrate and the inclined surface. The reason for this is that, when the sealing portion 19 has the inclined surface as described above, the amount of light emitted in an upper direction along the inclined surface is increased to improve luminous efficiency and optical properties.

Figure 6:
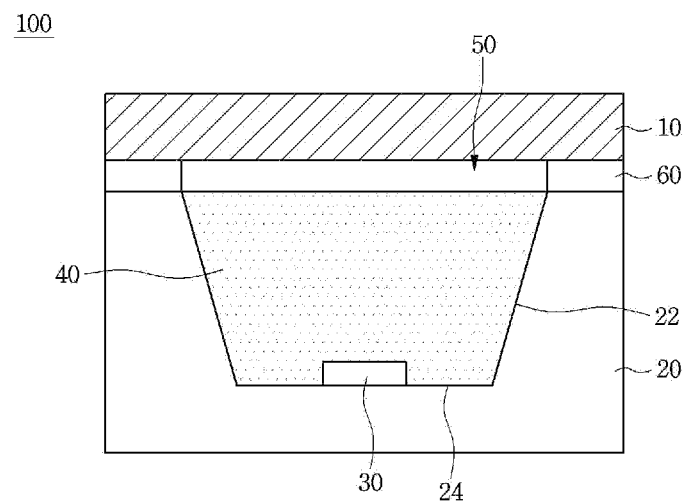
FIG. 6 illustrates a first embodiment of a light-emitting diode package of the present disclosure.
Figure 7:
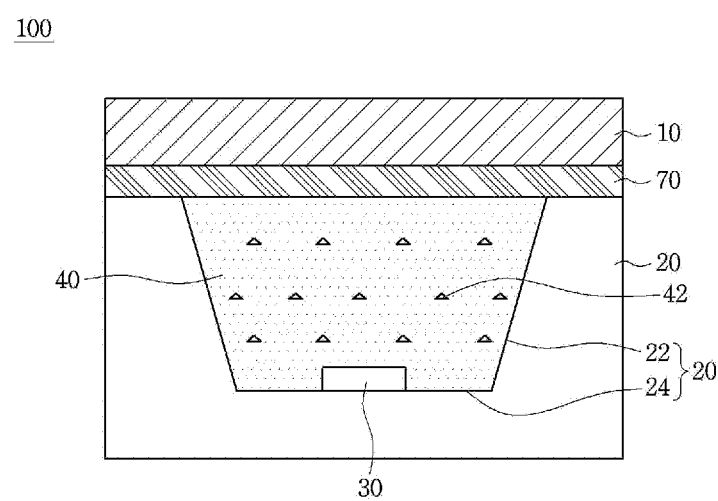
FIG. 7 illustrates a second embodiment of a light-emitting diode package of the present disclosure.
Figure 8:
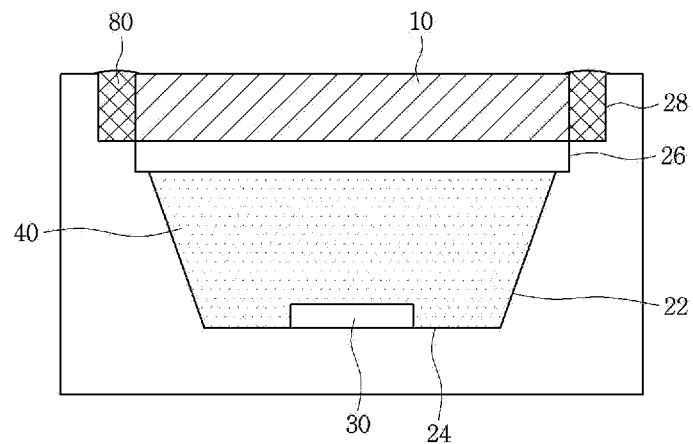
FIG. 8 illustrates a third embodiment of a light-emitting diode package of the present disclosure.

Next, a light-emitting diode package of the present disclosure will be described. As illustrated in FIGS. 6 to 8, a light-emitting diode package 100 according to an embodiment of the present disclosure includes a package body 20, a light-emitting diode chip 30, an encapsulation layer 40, and the light conversion plate 10.

Further, the package body 20 includes a groove composed of inner surfaces 22 inclined upward and a bottom surface 24, and the light-emitting diode chip 30 is mounted on the bottom surface 24 of the package body 20. In this instance, the light-emitting diode chip 30 emits light having a specific wavelength range, where the light-emitting diode chip 30, for example, may be a blue light-emitting diode emitting blue light, but the embodiment of the present disclosure is not limited thereto.

In addition, a lead frame may be formed on the bottom surface of the groove, and the lead frame and an electrode portion of the light-emitting diode chip can be connected with a wire. The encapsulation layer 40 for sealing the light-emitting diode chip 30 is filled in the groove of the package body 20. Further, the encapsulation layer 40 protects the light-emitting diode chip 30 from external environment, such as moisture, and may be formed of a transparent resin such as a silicon resin and/or an epoxy resin.

As illustrated in FIG. 7, phosphor particles 42 may be included in the encapsulation layer 40 if necessary. In this instance, the phosphor particles 42 may be at least one selected from SiAlON-based phosphor, a LSN-based phosphor, a YAG-based phosphor, a TAG-based phosphor, a nitride-based phosphor, a silicate-based phosphor, and a LuAG-based phosphor. For example, the phosphor particles 42 may be a green light-emitting phosphor converting the incident light into green light having a wavelength range of 490 nm to 580 nm or may be a red light-emitting phosphor converting the incident light into red light having a wavelength range of 600 nm to 700 nm, but the embodiment of the present disclosure is not limited thereto.

The light conversion plate 10 is disposed on the encapsulation layer 40. In this instance, the light conversion plate 10 is the same as the above-described light conversion plate 10 of the present disclosure. That is, it is the light conversion plate including the first glass substrate, the light conversion layer disposed on the first glass substrate and including the quantum dots that convert the incident light into the light having a specific wavelength range, and the second glass substrate disposed on the light conversion layer, where the plurality of protrusion patterns are formed on the surface of at least one of the first glass substrate and the second glass substrate. Because the light conversion plate 10 has been already described, the detailed description thereof are omitted.

An air gap 50 may be formed between the encapsulation layer 40 and the light conversion plate 10 as illustrated in FIG. 6. The air gap 50, as illustrated in FIG. 6, may be formed by a method in which at least one spacer 60 is disposed between the encapsulation layer 40 and the light conversion plate 10. Although it has been illustrated in FIG. 6 that the spacer 60 is formed on a top surface of the package body 20, the embodiment of the present disclosure is not limited thereto. That is, the spacer 60 may be formed in an upper area of the encapsulation layer 40. Also, the spacer 60 may be provided in the form in which some areas of the encapsulation layer 40 protrude.

As illustrated in FIG. 7, a low refractive index layer 70, instead of the air gap, may be formed between the encapsulation layer 40 and the light conversion plate 10. In this instance, because the low refractive index layer 70 is denoted as a layer that is formed of a material having a lower refractive index than the glass substrate and encapsulation layer, the low refractive index layer 70 may be formed of a material having a refractive index of about 1.3 to about 1.4. Specifically, the low refractive index layer may be formed of at least one material from an alkoxysilane-based resin, a fluorine-based resin, and a urethane-based resin, but the embodiment of the present disclosure is not limited thereto.

Because the light conversion plate 10 of the present disclosure uses the glass substrate, the light conversion plate 10 may be easily broken by external impact. However, when the low refractive index layer 70 is disposed between the encapsulation layer 40 and the light conversion plate 10 as described above, because the low refractive index layer 70 stably supports the glass substrate, it prevents the breakage of the glass substrate due to the external impact. Also, when the air gap or the low refractive index layer is formed between the encapsulation layer 40 and the light conversion plate 10 as described above, an effect of improving the luminous efficiency can be obtained while the amount of light recycled at an interface between the light conversion plate and the encapsulation layer is increased.

Figure 12:
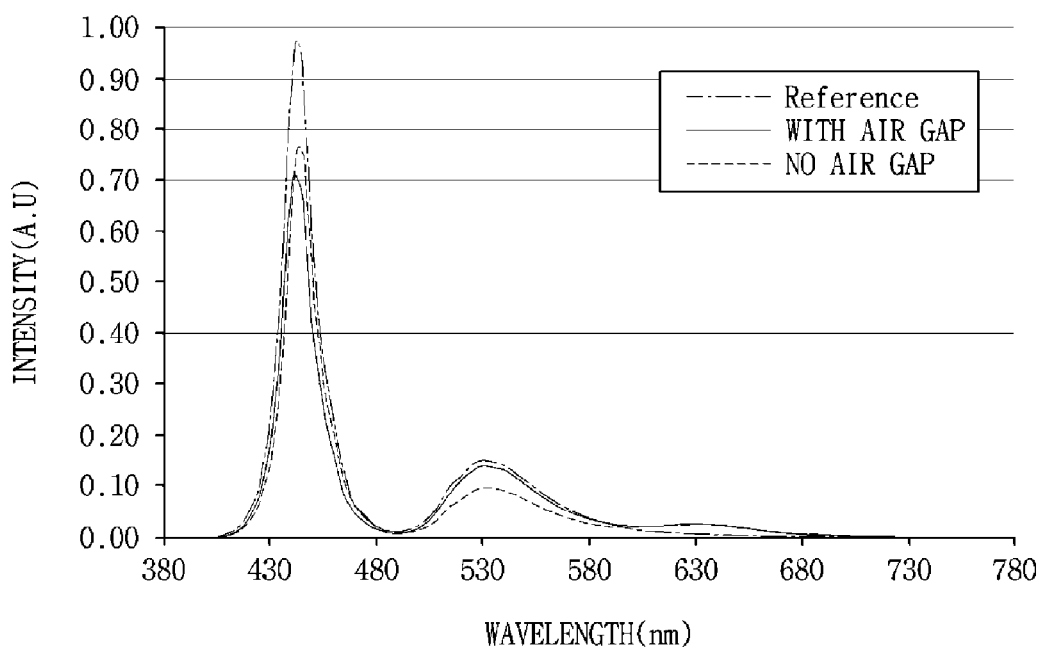
FIG. 12 is a graph comparing light intensities of light-emitting diode packages depending on the presence of an air gap.

In addition, FIG. 12 illustrates a graph in which light intensities of light-emitting diode packages for each wavelength depending on the presence of the air gap between the encapsulation layer and the light conversion plate are measured. For the measurement, a light-emitting diode package using a blue light-emitting diode chip and containing a green light-emitting phosphor in the encapsulation layer and a light conversion plate including red quantum dots were used, and the light intensity of the light-emitting diode package (reference), in which the light conversion plate is not stacked, for each wavelength was also measured for comparison. As illustrated in FIG. 12, an amount of light extraction in a wavelength range of 480 nm to 580 nm for when the air gap existed was higher than that of when the air gap did not exist. Also, when the air gap existed, it was observed that the intensity of light in the entire wavelength range was also higher.

Specifically, when a luminous efficiency of the light-emitting diode package, in which the light conversion plate was not stacked, was denoted as 100%, a luminous efficiency of the light-emitting diode package, in which the light conversion plate was stacked with the air gap, was about 94% and a luminous efficiency of the light-emitting diode package, in which the light conversion plate was directly stacked without the air gap, was about 72%. Also, when a low refractive index layer having a refractive index of 1.3 to 1.4 was formed between the encapsulation layer and the light conversion plate, a luminous efficiency of about 80% to about 85% was obtained.

According to another embodiment of the present disclosure, the package body 20, as illustrated in FIG. 8, can be processed so that inner side surfaces thereof have two steps 26 and 28. For convenience only, the step formed on a side relatively close to a bottom surface of the package body is denoted as the first step 26, and the step formed on a side relatively far from the bottom surface is denoted as the second step 28. An air gap 60 or a low refractive index layer may also be disposed in a space formed by the first step 26, and a light conversion plate 10 may be inserted into a space which is formed by the second step 28.

When the package body 20 having the two steps 26 and 28 formed on the inner side surfaces thereof is used, the light conversion plate 10 and the light-emitting diode package can be accurately aligned by a simple method. After the light conversion plate 10 is aligned by being inserted into the second step 28, a side portion of the light conversion plate 10 is coated with a sealant 80 and the sealant 80 is then cured by UV curing so that the light conversion plate 10 may be fixed to the light-emitting diode package.

Figure 9:
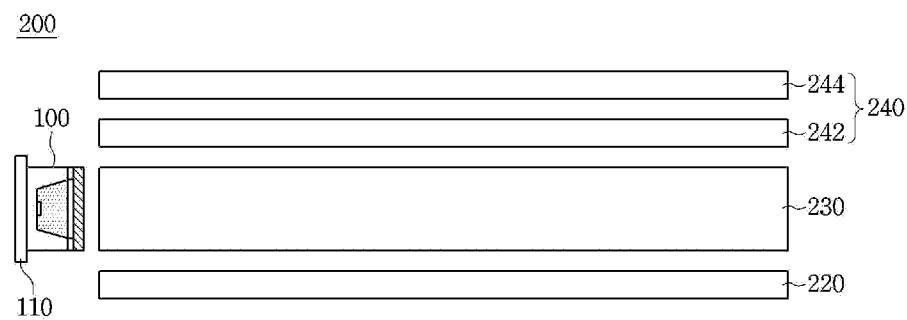
FIG. 9 illustrates an edge type backlight unit in which the light-emitting diode package of the present disclosure is used.
Figure 10:
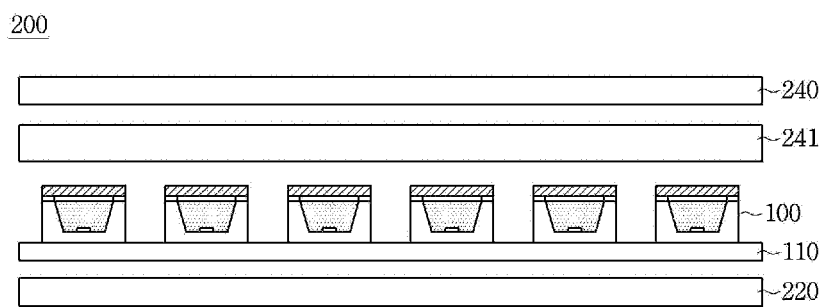
FIG. 10 illustrates a direct type backlight unit in which the light-emitting diode package of the present disclosure is used.

Next, a backlight unit 200 of the present disclosure will be described. As illustrated in FIGS. 9 and 10, the backlight unit 200 of the present disclosure uses the light-emitting diode package of the present disclosure as a light source. In this instance, the backlight unit may be an edge type backlight unit or a direct type backlight unit. First, the edge type backlight unit of the present disclosure will be described with reference to FIG. 9. As illustrated in FIG. 9, the edge type backlight unit of the present disclosure includes a light guide plate 230, a light source unit which is disposed on at least one side of the light guide plate 230 and includes the light-emitting diode package 100 of the present disclosure as a light source, a reflection member 220 disposed under the light guide plate 230, and an optical film 240 disposed on the light guide plate 230.

The light source unit includes a plurality of light sources 100 and a printed circuit board 110 on which the plurality of light sources is mounted. In this instance, the light source is composed of the light-emitting diode package of the present disclosure. Because the light-emitting diode package has been already described, the detailed description thereof will be omitted.

The light sources 100 are mounted on the printed circuit board 110 and can be driven by a driving signal supplied through the printed circuit board. The light source unit is disposed on a side of the light guide plate 230. The light guide plate 230 functions to uniformly guide light provided from the light source 100 to a display panel through total reflection, refraction, and scattering. Although it has been illustrated in FIG. 9 that the light guide plate 230 is formed to have a constant thickness, the shape of the light guide plate 230 is not limited thereto. For example, a thickness of the light guide plate 230 may be formed so the center is thinner than both sides of the light guide plate 230 so as to reduce a total thickness of the backlight unit 200, and the thickness of the light guide plate 230 may be formed to gradually decrease from the light source unit.

Also, in order to provide a uniform surface light source, one surface of the light guide plate 230 may include a pattern having a specific shape. For example, the light guide plate 230 may include various patterns, such as an elliptical pattern, a polygon pattern, and a hologram pattern, to guide the light incident on the inside of the light guide plate 230. Although FIG. 9 illustrates the light source unit is disposed on one side of the light guide plate 230, the embodiment of the present disclosure is not limited thereto. That is, the light source unit may be disposed at both sides of the light guide plate 230.

Next, the reflection member 220 functions to increase the luminous efficiency by reflecting light emitted from the bottom of the light guide plate 230 to re-enter into the light guide plate 230, where the reflection member 220 is disposed under the light guide plate 230. Reflection members well known in the art may be used as the reflection member 220 without restriction, and, for example, a metallic reflection sheet may be used.

Further, at least one optical film 240 for improving optical properties may be disposed on the light guide plate 230. In this instance, the optical film 240 may include a diffuser sheet 242 for improving light uniformity by diffusing the light emitted from the light guide plate, or condensing sheets 244 for improving front brightness by aligning the light in a specific direction. Examples of the condensing sheet include a prism sheet, a lenticular sheet, and a DBEF film. Appropriate sheets may be combined and used as the optical film according to the required optical properties. Further, the light source unit, the light guide plate, and the optical films may be disposed and accommodated in a bottom case.

Next, the direct type backlight unit 200 of the present disclosure will be described with reference to FIG. 10. As illustrated in FIG. 10, the direct type backlight unit 200 of the present disclosure includes a diffuser plate 241, a light source unit which is disposed under the diffuser plate 241 and includes the light-emitting diode package 100 as a light source, an optical film 240 disposed on the diffuser plate 241, and a reflection member 220 disposed under the light source unit.

Similar to the edge type backlight unit, the light source unit includes a plurality of light sources 100 and a printed circuit board 110 on which the plurality of light sources is mounted. The light source is composed of the light-emitting diode package of the present disclosure. However, different from the edge type backlight unit, the light source unit is disposed under the diffuser plate 241 in the direct type backlight unit. The diffuser plate 241 is an optical member for concealing the light source and improving the luminous efficiency by diffusing the light emitted from the light source unit. The optical films 240 for improving optical properties and brightness are disposed on the diffuser plate 241. The above-described diffuser sheet and/or condensing sheets may be used as the optical films 240.

Next, the reflection member 220 is for improving light-use efficiency by reflecting the light emitted toward the bottom of the backlight unit to proceed toward the display panel, wherein the reflection member 220 is disposed under the light source unit. Reflection members well known in the art may be used as the reflection member 220 without restriction, and, for example, a metallic reflection sheet may be used. Further, the light source unit, the light guide plate, and the optical films may be disposed and accommodated in a bottom case.

Figure 11:
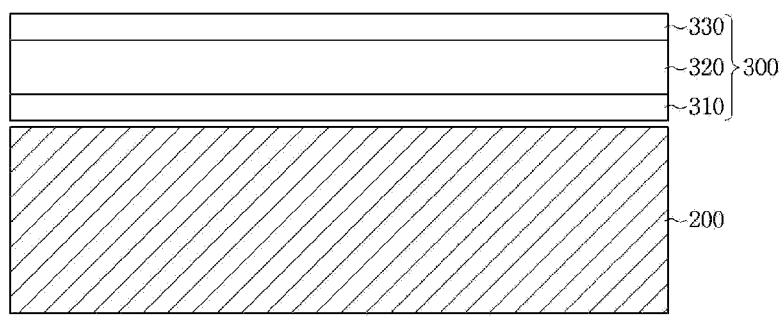
FIG. 11 illustrates a display device of the present disclosure.

Next, a display device of the present disclosure will be described. As illustrated in FIG. 11, the display device of the present disclosure includes a backlight unit 200 and a display panel 300 disposed on the backlight unit 200. In this instance, because the backlight unit 200 is the same as the above-described backlight unit 200 of the present disclosure, only the display panel 300 will be described below.

The display panel 300 may be a liquid crystal display panel (LCD). For example, the display panel 300 includes an upper substrate 330, a lower substrate 310 disposed to be spaced apart from the upper substrate 330, and a liquid crystal layer 320 sandwiched between the upper substrate 330 and the lower substrate 310. Also, an upper polarizing plate and a lower polarizing plate for selectively transmitting specific polarized light are respectively disposed on a top surface of the upper substrate 330 and a rear surface of the lower substrate 310.

Further, the display panel is divided into a display area and a non-display area. In the display area, a gate line and a data line are disposed on one surface of the lower substrate 310. The gate line and the data line perpendicularly cross each other having a gate dielectric layer disposed therebetween to define a pixel area.

The lower substrate 310 may be a thin film transistor substrate. A thin film transistor is disposed in the area, in which the gate line and the data line cross each other, on the one surface of the lower substrate 310. That is, the thin film transistor is included in the pixel area. Also, a pixel electrode is disposed in each pixel area on the one surface of the lower substrate 310. The thin film transistor and the pixel electrode are electrically connected to each other.

The thin film transistor is composed of a gate electrode, a semiconductor layer, a source electrode, and a drain electrode. The gate electrode may be formed by branching from the gate line. Also, the source electrode may be formed by branching from the data line. The pixel electrode may be electrically connected to the drain electrode of the thin film transistor. The thin film transistor may be formed in a bottom gate structure, a top gate structure, or a double gate structure. That is, with respect to the thin film transistor, various changes and modifications may be made in the configuration of the thin film transistor without departing from the scope of the embodiment.

The upper substrate 330 may be a color filter substrate. A black matrix in the form of a grid surrounding the pixel area while screening the non-display area, such as the thin film transistor formed on the lower substrate 310, is disposed on one surface of the upper substrate 330 of the display panel 300. Also, the upper substrate 330 may include a red color filter, a green color filter, and a blue color filter which are alternatingly disposed to correspond to each pixel area in the grid.

Also, the display panel 300 includes a common electrode forming an electric field with the pixel electrode to drive the liquid crystal layer. A method of controlling the arrangement of liquid crystal molecules may include a twisted nematic (TN) mode, a vertical alignment (VA) mode, an in plane switching (IPS) mode, or a fringe field switching (FFS) mode. The common electrode may be disposed on the upper substrate 330 or the lower substrate 310 according to the method of controlling the arrangement of the liquid crystal molecules.

Furthermore, the display panel 300 may have a different structure in addition to the structure illustrated in FIG. 11. For example, the above display panel may be a display panel having a color filter on transistor (COT) structure in which a thin film transistor, a color filter, and a black matrix are formed on a lower substrate. In this instance, a protective layer may be formed between the thin film transistor and the color filter. Also, a pixel electrode in contact with the thin film transistor is disposed on the lower substrate. In this instance, the black matrix may be omitted to improve an aperture ratio and simplify a mask process, and the common electrode may be formed so as to also play a role of the black matrix.

In addition, the display panel 300 is connected to a driving circuit unit for supplying a driving signal from the outside. The driving circuit unit may be mounted on the substrate of the display panel 300 or may be connected to the display panel 300 through a connecting member such as a tape carrier package.

Because a light conversion layer is disposed between glass substrates having excellent barrier properties, a light conversion plate of the present disclosure may effectively prevent the degradation of quantum dots. Also, because a protrusion pattern is formed on a surface of a glass substrate, the light conversion plate of the present disclosure minimizes reflection at the surface of the glass substrate and maximizes light extraction performance. Thus, a luminous efficiency of a light-emitting diode package may be improved.

Further, because an air gap or a low refractive index layer is disposed between the light conversion plate and an encapsulation layer to maximize light recycling in the light-emitting diode package, the light-emitting diode package of the present disclosure improves the efficiency of the light-emitting diode package and obtains high-quality white light.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A light conversion plate comprising:
a first glass substrate;
a light conversion layer disposed on the first glass substrate and including quantum dots that convert incident light into light having a specific wavelength range; and
a second glass substrate disposed on the light conversion layer,
wherein a surface of at least one of the first glass substrate and the second glass substrate includes a plurality of protrusion patterns, and
wherein the light conversion layer has a superlattice structure in which quantum dots and inorganic nanoparticles are regularly arranged, the inorganic nanoparticles surrounding the quantum dot.

2. The light conversion plate of claim 1, wherein the plurality of protrusion patterns include:
a first protrusion pattern formed on the surface of the first glass substrate; and
a second protrusion pattern formed on the surface of the second glass substrate.

3. The light conversion plate of claim 2, wherein the first protrusion pattern and the second protrusion pattern have a same average spacing.

4. The light conversion plate of claim 2, wherein the first protrusion pattern and the second protrusion pattern have different average spacings.

5. The light conversion plate of claim 1, further comprising:
a sealing portion for sealing a gap between the first glass substrate and the second glass substrate.

6. The light conversion plate of claim 5, wherein the sealing portion is disposed between the first glass substrate and the second glass substrate and side surfaces of the first and second glass substrates.

7. The light conversion plate of claim 5, wherein the sealing portion and the light conversion layer are spaced apart from each other.

8. The light conversion plate of claim 7, wherein a distance between the sealing portion and the light conversion layer is in a range of 0.1 mm to 0.5 mm.

9. The light conversion plate of claim 5, wherein the sealing portion has an inclined surface, and
wherein an angle between the inclined surface and the first glass substrate is greater than an angle between the inclined surface and the second glass substrate.

10. A light-emitting diode package comprising:
a package body including a groove including inner side surfaces and a bottom surface;
a light-emitting diode chip mounted on the bottom surface of the package body;
an encapsulation layer sealing the light-emitting diode chip;
a light conversion plate disposed on the encapsulation layer; and
an air gap between the encapsulation layer and the light conversion plate,
wherein the light conversion plate comprises:
a first glass substrate,
a light conversion layer disposed on the first glass substrate and including quantum dots that convert incident light into light having a specific wavelength range, and
a second glass substrate disposed on the light conversion layer, and
wherein a surface of at least one of the first glass substrate and the second glass substrate includes a plurality of protrusion patterns.

11. The light-emitting diode package of claim 10, further comprising:
a low refractive index layer having a refractive index of 1.3 to 1.4 between the encapsulation layer and the light conversion plate.

12. The light-emitting diode package of claim 10, further comprising:
at least one spacer between the encapsulation layer and the light conversion plate.

13. The light-emitting diode package of claim 10, wherein the encapsulation layer comprises a phosphor.

14. The light-emitting diode package of claim 10, wherein the inner side surfaces of the package body have two steps.

15. A backlight unit, comprising:
a light emitting diode package as a light source;
a reflection member configured to reflect light emitted by the light source; and
an optical film disposed above the reflection member,
wherein the light emitting diode package includes:
a package body including a groove including inner side surfaces and a bottom surface;
a light-emitting diode chip mounted on the bottom surface of the package body;
an encapsulation layer sealing the light-emitting diode chip; and
a light conversion plate disposed on the encapsulation layer,
wherein the light conversion plate comprises:
a first glass substrate;

a light conversion layer disposed on the first glass substrate and including quantum dots that convert incident light into light having a specific wavelength range; and a second glass substrate disposed on the light conversion layer, wherein a surface of at least one of the first glass substrate and the second glass substrate includes a plurality of protrusion patterns, and wherein the light conversion layer has a superlattice structure in which quantum dots and inorganic nanoparticles are regularly arranged, the inorganic nanoparticles surrounding the quantum dot.

16. The backlight unit of claim 15, further comprising:
a light guide plate disposed between the reflection member and the optical film,
wherein the light-emitting diode package is disposed at least one side of the light guide plate.

17. The backlight unit of claim 15, further comprising:
a diffuser plate disposed between the reflection member and the optical film,
wherein the light-emitting diode package is disposed between the reflection member and the diffuser plate.

18. A display device comprising:
a backlight unit; and
a display panel disposed on the backlight unit,
wherein the backlight unit includes:
a light emitting diode package as a light source;
a reflection member configured to reflect light emitted by the light source; and
an optical film disposed above the reflection member,
wherein the light emitting diode package includes:
a package body including a groove including inner side surfaces and a bottom surface;
a light-emitting diode chip mounted on the bottom surface of the package body;
an encapsulation layer sealing the light-emitting diode chip; and
a light conversion plate disposed on the encapsulation layer,
wherein the light conversion plate comprises:
a first glass substrate;
a light conversion layer disposed on the first glass substrate and including quantum dots that convert incident light into light having a specific wavelength range; and
a second glass substrate disposed on the light conversion layer,
wherein a surface of at least one of the first glass substrate and the second glass substrate includes a plurality of protrusion patterns, and
wherein the light conversion layer has a superlattice structure in which quantum dots and inorganic nanoparticles are regularly arranged, the inorganic nanoparticles surrounding the quantum dot.

* * * * *